US005169806A

United States Patent [19]

Hawkins et al.

[11] Patent Number: 5,169,806

[45] Date of Patent: Dec. 8, 1992

[54] METHOD OF MAKING AMORPHOUS DEPOSITED POLYCRYSTALLINE SILICON THERMAL INK JET TRANSDUCERS

[75] Inventors: William G. Hawkins; Olaf Muller, both of Webster, N.Y.

[73] Assignee: Xerox Corporation, Stamford, Conn.

[21] Appl. No.: 589,788

[22] Filed: Sep. 26, 1990

[51] Int. Cl.[5] .......... H01L 21/469

[52] U.S. Cl. .......... 437/233; 437/967; 437/973; 148/DIG. 122; 148/DIG. 154

[58] Field of Search .......... 437/233, 967, 973; 148/DIG. 122, DIG. 154

[56] References Cited

U.S. PATENT DOCUMENTS 4,358,326 11/1982 Doo .......... 437/967
4,452,645 6/1985 Chu et al. .......... 437/933
4,693,759 9/1987 Noguchi et al. .......... 148/DIG. 61

OTHER PUBLICATIONS

S. Wolf & R. N. Tauber *Silicon Processing for the VLSI Era Volume 1: Process Technology* Lattice Press; Sunset Beach, CA (1986) pp. 169-180.

*Primary Examiner*—Brian E. Hearn
*Assistant Examiner*—Linda J. Fleck
*Attorney, Agent, or Firm*—Oliff & Berridge

[57] ABSTRACT

A resistive heating element is formed by depositing an amorphous silicon film on selected portions of a substrate and heating the deposited amorphous silicon film so that it undergoes solid phase epitaxy to form a (111) textured polycrystalline silicon film. The method is particularly useful for forming electro-thermal transducers for thermal ink jet printheads.

20 Claims, 4 Drawing Sheets

METHOD OF MAKING AMORPHOUS DEPOSITED POLYCRYSTALLINE SILICON THERMAL INK JET TRANSDUCERS

BACKGROUND OF THE INVENTION

1. Field of the Invention

The present invention relates generally to resistive heating elements, and in particular to resistive heating elements used for thermal ink jet printhead transducers and to methods of fabricating resistive heating elements for thermal ink jet printheads.

2. Description of Related Art

Thermal ink jet printing systems use thermal energy selectively produced by resistors located in capillary filled ink channels near channel terminating nozzles or orifices to vaporize momentarily the ink and form bubbles on demand. Each temporary bubble expels an ink droplet and propels it towards a recording medium. The printing system may be incorporated in either a carriage type printer or a pagewidth type printer. The carriage type printer generally has a relatively small printhead, containing the ink channels and nozzles. The printhead is usually sealingly attached to a disposable ink supply cartridge and the combined printhead and cartridge assembly is reciprocated to print one swath of information at a time on a stationarily held recording medium, such as paper. After the swath is printed, the paper is stepped a distance equal to the height of the printed swath, so that the next printed swath will be contiguous therewith. The procedure is repeated until the entire page is printed. For an example of a cartridge type printer, refer to U.S. Pat. No. 4,571,599 to Rezanka. In contrast, the pagewidth printer has a stationary printhead having a length equal to or greater than the width of the paper. The paper is continually moved past the pagewidth printhead in a direction normal to the printhead length and at a constant speed during the printing process. Refer to U.S. Pat. No. 4,463,359 to Ayata et al for an example of pagewidth printing and especially FIGS. 17 and 20 therein.

U.S. Pat. No. 4,463,359 mentioned above discloses a printhead having one or more ink filled channels which are replenished by capillary action. A meniscus is formed at each nozzle to prevent ink from weeping therefrom. A resistor or heater is located in each channel upstream of the nozzles. Current pulses representative of data signals are applied to the resistors to momentarily vaporize the ink in contact therewith and form a bubble for each current pulse. Ink droplets are expelled from each nozzle by the growth of the bubbles which causes a quantity of ink to bulge from the nozzle and break off into a droplet at the beginning of the bubble collapse. The current pulses are shaped to prevent the meniscus from breaking up and receding too far into the channels, after each droplet is expelled. Various embodiments of linear arrays of thermal ink jet devices are shown, such as those having staggered linear arrays attached to the top and bottom of a heat sinking substrate for the purpose of obtaining a pagewidth printhead. Such arrangements may also be used for different colored inks to enable multi-colored printing.

Ink-jet printheads include an array of nozzles which may be formed out of silicon wafers using orientation dependent etching (ODE) techniques. The use of silicon wafers is advantageous because ODE techniques can form structures, such as nozzles, on silicon wafers in a highly precise manner. The resulting nozzles are generally triangular in cross-section. Thermal ink jet printheads made by using the above-mentioned ODE techniques are typically comprised of a channel plate which contains a plurality of nozzle-defining channels located on a lower surface thereof bonded to a heater plate having a plurality of resistive heater elements formed on an upper surface thereof and arranged so that a heater element is located in each channel. The upper surface of the heater plate typically includes insulative layers which are patterned to form recesses exposing the individual heating elements.

The heater plate is typically formed from a semiconductive material such as, for example, silicon coated by a layer of silicon dioxide ($SiO_2$), which is used as a base, and the resistive heating elements are usually a polycrystalline silicon layer deposited over selected portions of the $SiO_2$ layer on the base. Lead and exit terminals are also patterned on the $SiO_2$ coated over the resistors so that electrical impulses can be selectively supplied to each resistive heating element based upon the text to be printed. Examples of particular constructions used for forming thermal ink jet printheads are provided in U.S. Pat. Nos. 4,601,777 to Hawkins et al and 4,789,425 to Drake et al, the disclosures of which are herein incorporated by reference. In particular, note U.S. Pat. No. 4,601,777 at column 7, lines 21–55 and U.S. Pat. No. 4,789,425 at column 7, lines 22–39 for discussions describing previous methods of forming electro-thermal transducers or heating elements by depositing polycrystalline silicon.

Polycrystalline silicon doped to a sheet resistance in the range of 20Ω to 100Ω has been demonstrated to be an excellent resistor material for forming the resistive heating elements or transducers. The silicon layer is formed by thermal decomposition of silane at above 600° C. The thermally decomposed silane is flowed past $SiO_2$ coated silicon wafers (used to form a plurality of heater plates) at a pressure of 200m Torr, and hence, the process is called low pressure chemical vapor deposition (LPCVD). Since the LPCVD of silicon is performed at temperatures above 600° C., the silicon film deposited on the $SiO_2$ coated wafers is polycrystalline.

A number of problems result from forming resistive heating elements by depositing polycrystalline silicon. When polycrystalline silicon is deposited, the film has a grainy texture because the epitaxial growth rate of silicon is orientation dependent, and many orientations of crystallites nucleate on the $SiO_2$ base surface. In other words, since individual crystals are initially deposited on the $SiO_2$ surface in a random, uncontrolled manner, and further crystals deposited on the randomly deposited initial crystals extend in directions dependent on the positions of the initial crystals, the resulting polycrystalline film will be grainy as opposed to smooth. Additionally, each resistive heating element will differ in its degree of graininess and distribution of crystals so that the resistance of each transducer will differ. This variation in grain size and orientation is further exasperated by the process used to deposit the polycrystalline silicon. In a typical LPCVD reactor, the wafers are stacked at about 3/16 inches spacing down an about 30 inch temperature zone. The temperature is typically ramped from low temperature at the gas inlet end to high temperature at the exhaust end to compensate for depletion of silane as it deposits on the wafers and other surfaces. A consequence of temperature ramping is variation in preferred orientation and grain size down the furnace load. Since the same voltage is applied across each transducer during operation, transducers having different resistances will heat to different temperatures causing the size of droplets of ink expelled from different nozzles to differ. Thus, the darkness of the text printed will differ slightly depending on the resistance of the transducer provided in each nozzle of the printhead. This difference becomes more pronounced when printing in half-tone mode and is a limitation in the maximum quality achieveable by thermal ink jet printers.

Another adverse effect of the grainy surface formed by depositing polycrystalline silicon is a reduction in the useful life of the printhead. Although the grainy polysilicon heater surface is protected by other layers (such as silicon dioxide and tantalum), these other layers replicate the rough grainy texture of the underlying polysilicon. Each time a transducer is heated, the ink adjacent the transducer vaporizes and then condenses so that a droplet is expelled from a nozzle. This results in a collapsing bubble which terminates in a very small local area on the heater surface. This phenomenon is known as cavitation. This cavitation tends to damage the grainy surface of the transducer over time, especially at the uneven grain boundaries where the bonding is weakest and the impurity content is highest. The non-uniform structure of polycrystalline deposited films also could increase electromigration stresses and the intrinsic local stress of the transducer, both of which might contribute to an earlier failure of the transducers than would occur with a smooth, uniform transducer.

Sugata et al U.S. Pat. No. 4,847,639 discloses an ink jet recording head having electro-thermal transducers comprising a heat generating resistance layer composed of an amorphous material containing halogen and hydrogen atoms, and optionally silicon atoms, in a matrix of carbon atoms.

Tamura et al U.S. Pat. No. 4,565,584 discloses a method of producing a single crystal film on a single crystal substrate which is partially covered by an insulating film such as $SiO_2$. An amorphous or polycrystalline silicon film is deposited on the partially covered substrate in ultra-high vacuum. The amorphous or polycrystalline silicon film is turned into a single crystal by solid phase epitaxial growth by exposing the layer to two heat treatments. The portion of the single crystal substrate which is not covered by the $SiO_2$ film acts as a "seed" from which the single crystal film grows.

Moniwa et al U.S. Pat. No. 4,808,546 discloses a process for forming a thin film transistor by solid phase epitaxy. An amorphous silicon film is doped with an impurity and subjected to solid phase growth to form an amorphous Si film which is single-crystallized.

Foroni et al U.S. Pat. No. 4,725,810 discloses a method of making implanted resistors by implanting a high resistive value zone in a semiconductor region and depositing a layer of polycrystalline silicon to completely cover the implanted resistive zone.

OBJECTS AND SUMMARY OF THE INVENTION

It is an object of the present invention to provide resistive heating elements and methods of making resistive heating elements which are more uniform in structure and resistance than previous resistive heating elements.

It is another object of the present invention to provide resistive heating elements and methods of making resistive heating elements which have low intrinsic stresses and resist electromigration stresses.

It is a further object of the present invention to provide resistive heating elements for thermal ink jet printers and methods of making resistive heating elements for thermal ink jet printers which are resistant to cavitation damage.

To achieve the foregoing and other objectives, and to overcome the shortcomings discussed above, a method of forming a resistive heating element for a thermal ink jet printhead is disclosed wherein an amorphous silicon film is deposited on selected portions of a semiconductive substrate and the deposited amorphous silicon film is heated so that it undergoes solid phase epitaxy to form a polycrystalline silicon film.

BRIEF DESCRIPTION OF THE DRAWINGS

The invention will be described in detail with reference to the following drawings in which like reference numerals refer to like elements and wherein.

DETAILED DESCRIPTION OF THE PREFERRED EMBODIMENTS

Figure 1:
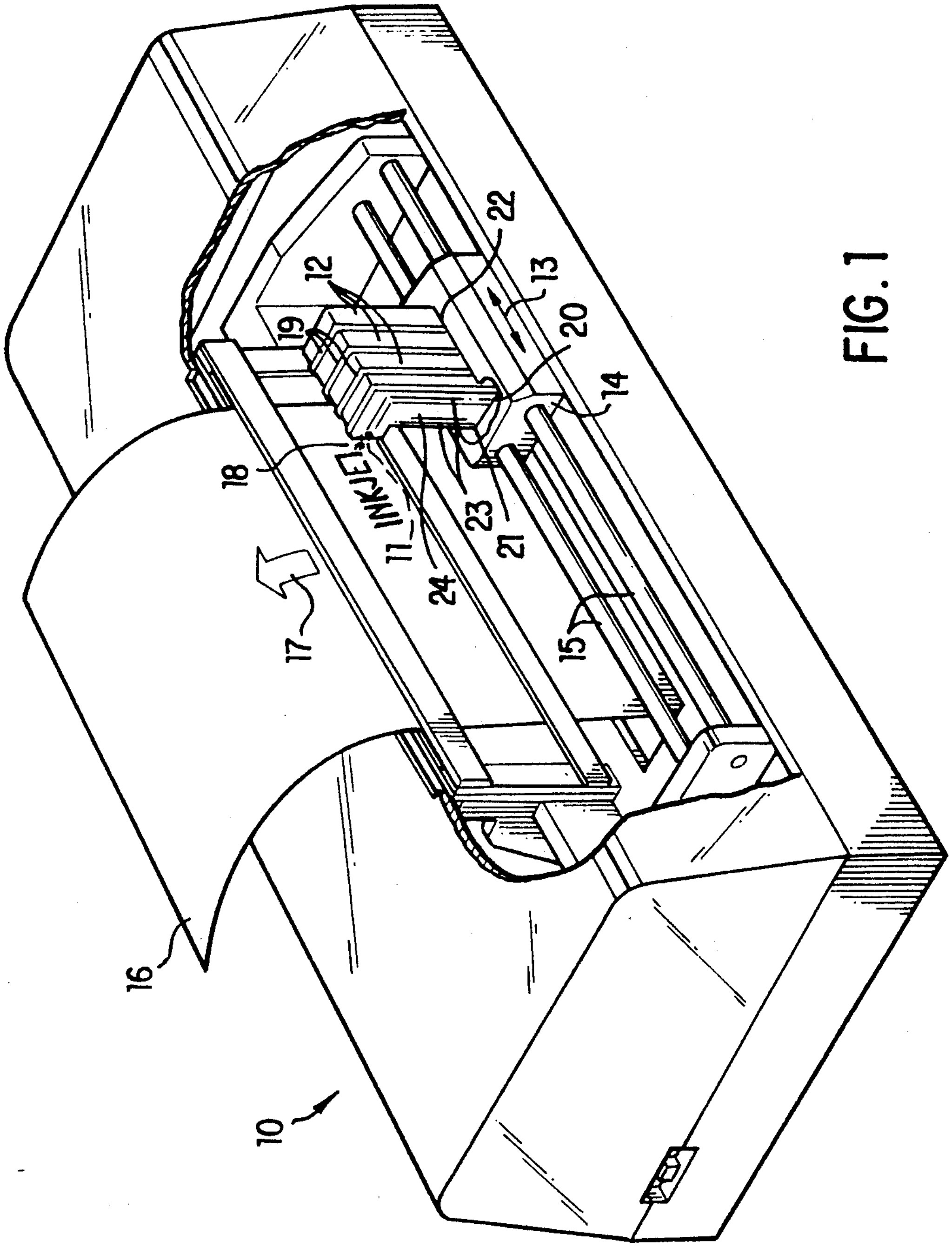
FIG. 1 is a schematic isometric view of a carriage-type thermal ink jet printing system incorporating the present invention.

One application of the present invention involves resistive heating elements and the formation of such resistive heating elements for use in thermal ink jet printheads. Thus, for purposes of illustration, a thermal ink jet printer and printhead structure similar to that disclosed in the above-incorporated U.S. Pat. No. 4,601,777 as well as U.S. Pat. No. 4,774,530, the disclosure of which is herein incorporated by reference, will be described. A printhead according to the present invention could be similar to those disclosed in the above-mentioned patents, except the resistive heating elements contained therein would be made by a process according to the present invention and thus would exhibit qualities superior to those of previous thermal ink jet printheads. It is understood that the present invention is also applicable to other thermal ink jet printhead configurations as well as other devices which require the use of resistive heating elements.

A typical carriage-type, multi-color, thermal ink jet printing device 10 is shown in Figure A linear array of ink droplet producing channels is housed in each printhead 11 of each ink supply cartridge 12 which may optionally be disposable. One or more ink supply cartridges are replaceably mounted on a reciprocating carriage assembly 14 which reciprocates back and forth in the direction of arrow 13 on guide rails 15. The channels terminate with orifices or nozzles aligned perpendicular to the carriage reciprocating direction and parallel to the stepping direction of the recording medium 16, such as paper. Thus, the printhead prints a swath of information on the stationary recording medium 16 as it moves in one direction. Prior to the carriage and printhead reversing direction, the recording medium 16 is stepped by the printing device a distance equal to the printed swath in the direction of arrow 17 and then the printhead moves in the opposite direction printing another swath of information. Droplets 18 are expelled and propelled to the recording medium from the nozzles in response to digital data signals received by the printing device controller (not shown), which in turn selectively addresses the individual heating elements located in the printhead channels a predetermined distance from the nozzles with a current pulse. The current pulses passing through the printhead heating elements vaporize the ink contacting the heating elements and produce temporary vapor bubbles to expel droplets of ink from the nozzles. Alternatively, several printheads may be accurately juxtapositioned to form a pagewidth array of nozzles. In this configuration (not shown), the nozzles are stationary and the paper moves there past. Examples of pagewidth array printheads are disclosed in Drake et al U.S. Pat. No. 4,829,324, Fisher et al U.S. Pat. No. 4,851,371, and Ayata et al U.S. Pat. No. 4,463,359, the disclosures of which are herein incorporated by reference.

In FIG. 1, several ink supply cartridges 12 and fixedly mounted electrode boards or daughterboards 19 are shown in which each sandwich therebetween a printhead 11, shown in dashed line. The printhead is permanently attached to the daughterboard and their respective electrodes are wire-bonded together. A printhead fill hole, discussed more fully later, is sealingly positioned against and coincident with an aperture (not shown) in the cartridge, so that ink from the cartridge is continuously supplied to the ink channels via the manifold during operation of the printing device. This cartridge is similar to and more fully described in Ivan Rezanka U.S. Pat. No. 4,571,599 and assigned to the same assignee as this application. Accordingly, U.S. Pat. No. 4,571,599 is herein incorporated by reference. Note that the lower portion 20 of each daughterboard 19 has electrode terminals 21 which extend below the cartridge bottom 22 to facilitate plugging into a female receptacle (not shown) in the carriage assembly 14. In the preferred embodiment, the printhead contains forty-eight channels on three mil centers for printing with a resolution of three hundred spots per inch (spi). Such a high density of addressing electrodes 23 on each daughterboard is more conveniently handled by having some of the electrodes terminate on both sides. In FIG. 1, the side 24 shown is opposite the one containing the printhead. The electrodes all originate on one side of the printhead, but some pass through the daughterboard. All the electrodes 23 terminate at daughterboard end 20.

Figure 2:
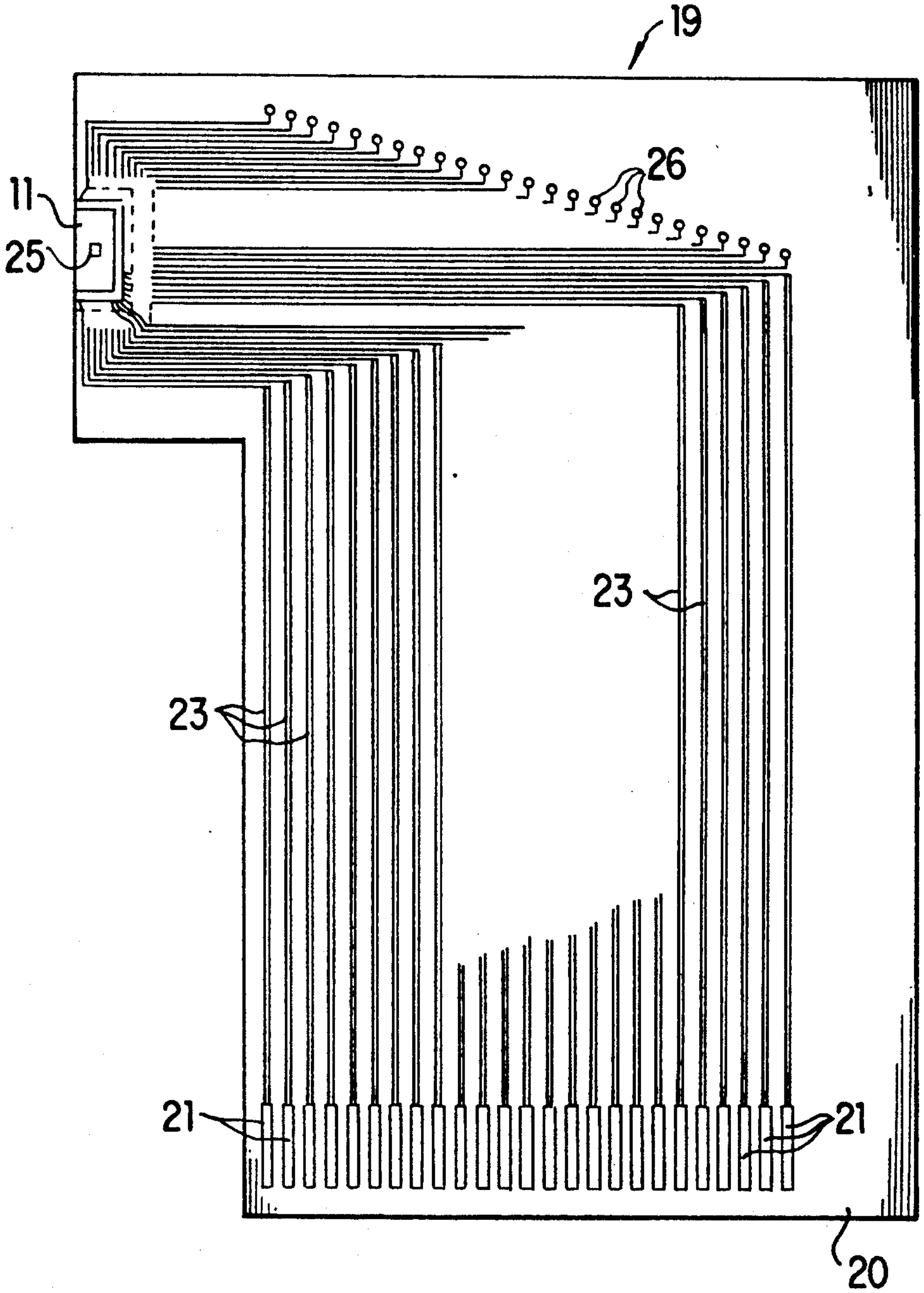
FIG. 2 is a plan view of the daughterboard and fixedly mounted printhead showing the electrode terminals of the printhead wire-bonded to one end of the electrodes of the daughterboard.
Figure 3:
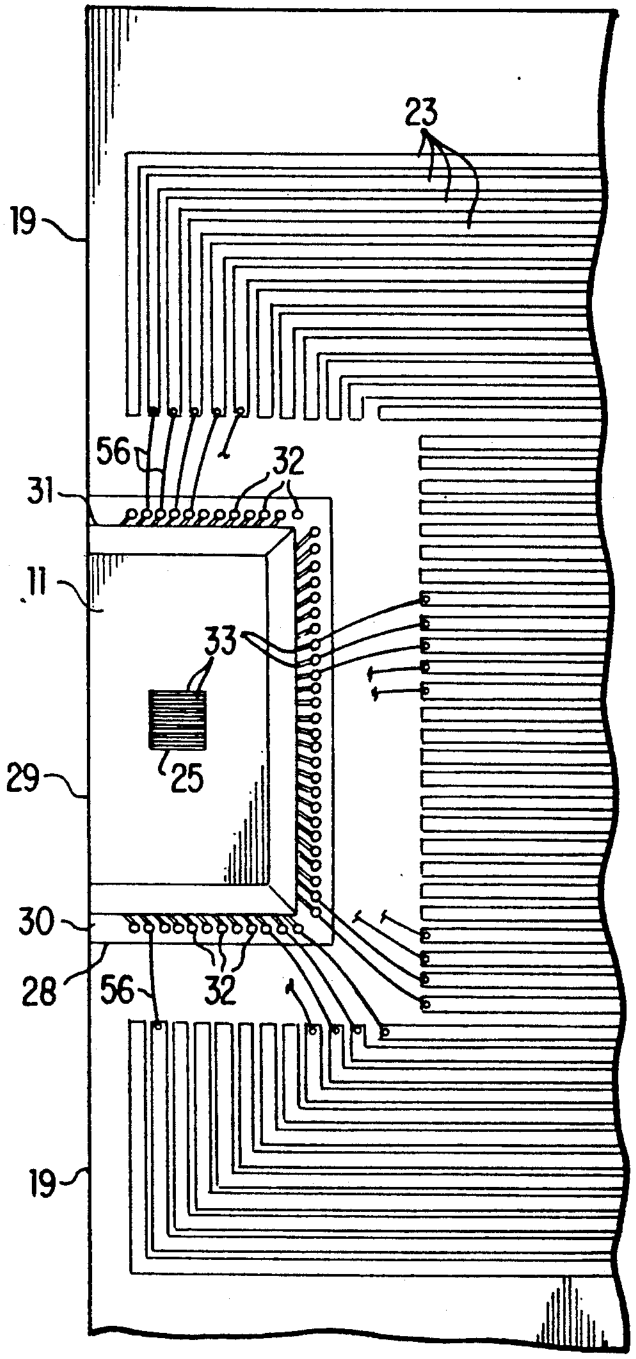
FIG. 3 is an enlarged plan view of the printhead attached to the daughterboard as shown in FIG. 2.

A plan view of the L-shaped daughterboard 19 is shown in FIG. 2. This view is of the side containing the printhead 11. The daughterboard electrodes 23 are on a one-to-one ratio with the electrodes of the printhead and are wire-bonded thereto as better shown in FIG. 3 and described later. The printhead fill hole 25 is readily apparent in FIG. 2. About half of the daughterboard electrodes 23 which are on the longer leg of the daughterboard are on the opposite surface thereof so that both sides of the daughterboard end portion 20 have substantially identical parallel arrays of terminals 21. The electrodes on the opposite side of the daughterboard are electrically connected through the daughterboard at locations 26. An enlarged, plan view of the printhead 11 of FIG. 2 is shown in FIG. 3 bonded to the daughterboard 19 with the printhead electrode terminals 32 wirebonded to one end of the daughterboard electrodes 23. The wire-bonds 56 are installed automatically by any standard wire-bonding machine.

Figure 4:
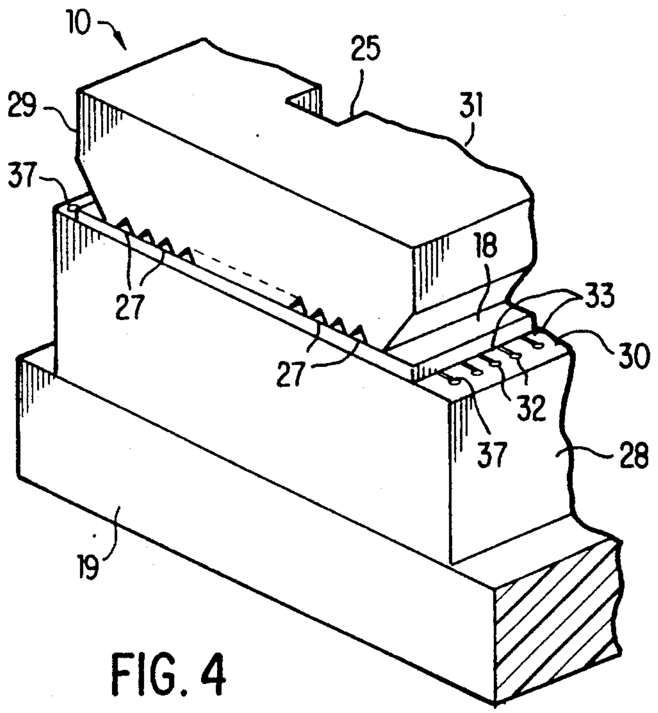
FIG. 4 is an enlarged isometric view of a printhead mounted on the daughterboard showing the ink droplet emitting nozzles.
Figure 5:
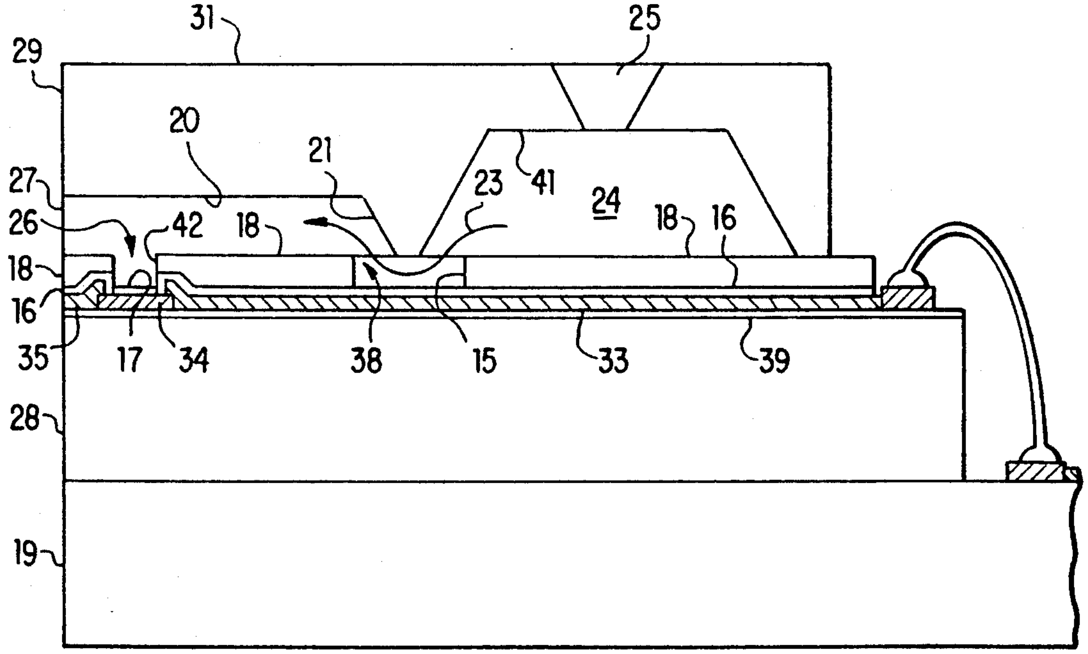
FIG. 5 is an enlarged cross-sectional view of a printhead along a line passing through the printhead through one of the nozzle defining channels thereof.

FIG. 4 is an enlarged schematic isometric view of the front face 29 of the printhead 10 showing the array of droplet emitting nozzles 27. Referring also to FIG. 5, discussed later, the lower electrically insulating substrate or heating element plate 28 has the heating elements 34 and addressing electrodes 33 patterned on surface 30 thereof, while the upper substrate or channel plate 31 has parallel grooves 20 which extend in one direction and penetrate through the upper substrate front face edge 29. The other end of grooves terminate at slanted wall 21. The floor 41 of the internal recess 24 which is used as the ink supply manifold for the capillary filled ink channels 20, has an opening 25 therethrough for use as an ink fill hole. The surface of the channel plate with the grooves is aligned and bonded to the heater plate 28, so that a respective one of the plurality of heating elements 34 is positioned in each channel, formed by the grooves and the lower substrate or heater plate 28. Ink enters the manifold formed by the recess 24 and the lower substrate 28 through fill hole 25 and by capillary action, fills the channels 20 by flowing through an elongated recess 38 formed in the thick film insulative layer 18. The ink at each nozzle forms a meniscus, the surface tension of which prevents the ink from weeping therefrom. The addressing electrodes 33 on the lower substrate or heater plate 28 terminate at terminals 32. The upper substrate or channel plate 31 is smaller than the lower substrate in order that the electrode terminals are exposed and available for wire-bonding to the electrodes on the daughterboard 19, on which printhead 10 is permanently mounted. Layer 18 is a thick film passivation layer, discussed later, sandwiched between upper and lower substrates. This layer is etched to expose the heating elements, thus placing them in a pit, and is etched to form the elongated recess to enable ink flow between the manifold 24 and the ink channels 20. In addition, the thick film insulative layer 18 is etched to expose the electrode terminals.

A cross-sectional view of FIG. 4 is taken along a line extending through one channel and shown as FIG. 5 to show how the ink flows from the manifold 24 and around the end 21 of the groove 20 as depicted by arrow 23. As disclosed in Torpey et al U.S. Pat. No. 4,638,337, a plurality of sets of bubble generating heating elements 34 and their addressing electrodes 33 are patterned on the polished side of a single side polished (100) silicon wafer. Prior to patterning the multiple sets of printhead electrodes 33, the resistive material that serves as the heating elements, and the common return 35, the polished surface of the wafer is coated with an under glaze 39 such as silicon dioxide ($SiO_2$) having a thickness of about 2 micrometers. The resistive heating elements, the formation of which constitutes the present invention, are fabricated as follows.

Previously, the resistive heating elements 34 were formed by depositing polycrystalline silicon on a portion of under glaze layer 39 by LPCVD to form a series of resistive heating elements 34 each being a layer of polycrystalline silicon. The present invention makes use of the characteristic of low pressure chemical vapor deposited silicon that when deposited on a surface at temperatures below 600° C., an amorphous as opposed to polycrystalline film is formed. The surface of amorphous silicon is very smooth because there are no preferred film growth sites. When the amorphous silicon film is heated to a temperature above 600° C., it undergoes solid phase epitaxy (SPE) to form a strongly (111) textured poly-crystalline silicon film. The SPE polysilicon retains a smooth surface texture and has a large and uniform grain size, in contrast with the polycrystalline deposited films. Since the thickness and structure of the resistive heating elements formed according to the present invention are much more uniform, the variations in resistance between different heating elements 34 is much less than was previously obtained when the silicon films were deposited in polycrystalline form. Additionally, the smooth upper surface is much more resistant to cavitation damage. The increased uniformity throughout the structure of each resistive heating element 34 results in each heating element being more resistant to electromigration stress and having a lower intrinsic stress. Thus, amorphous deposited SPE polycrystalline silicon films improve thermal ink jet transducer performance and life time.

According to the present invention, a plurality of wafers coated with under glaze layer 39 of silicon dioxide are masked so that only portions of the under glaze layer 39 upon which resistive heating elements 34 are to be chamber, and the pressure therein is lowered to 50 mTORR to 500 mTORR, preferably about 200 mTORR. At this point, silicon is deposited onto the masked wafers at a temperature below 580° C. to form amorphous silicon layers on the uncovered portions of the under glaze silicon dioxide layer 39 of each wafer. The thickness of the amorphous silicon layer is approximately 450 nm. About 90 minutes are required for an amorphous silicon film having a thickness of 450 nm to be deposited. The amorphous silicon film is deposited by the thermal decomposition of, for example, silane, disilane, or dichlorosilane, with silane being preferred. In the case of either silane or disilane, amorphous silicon deposition occurs below about 570° C., and a typical temperature range is 550–580° C. The transition to amorphous deposition also gives rise to low growth rate, so it is desirable to keep the temperature as high as possible.

After this deposition process is complete, the wafers are removed from the pressure chamber and placed in an oven where they are heated to a temperature above 600° C. When heated above 600° C., the amorphous LPCVD silicon film undergoes solid phase epitaxy to form a strongly (111) textured polycrystalline silicon film. Amorphous silicon recrystallizes to polysilicon above about 600° C. The process is very slow at 600–700° C. The ideal range is about 800° C. to about 1000° C. One preferred process involves heating the amorphous layer at about 800° C. for 30 minutes and then a 30 minute ramp to 1000° C. Subsequent to amorphous silicon deposition, the layer is doped with phosphorus at 870° C. and then oxidized in dry $O_2$ at 1000° C. Boron (p-type) and arsenic (n-type) can be used as an alternative to phosphorous (n-type) for doping polysilicon. Of the three, phosphorous is the best choice since it more efficiently dopes polysilicon.

After forming the resistive heating elements 34, the rest of the heater plate structure is formed according to conventional methods, well known in the art, which will be summarized below. A more in-depth description of the structure and process for forming thermal ink jet printheads from silicon wafers can be obtained from reading any of the above-incorporated patents. After forming the resistive heating elements 34, the common return 35 and the addressing electrodes 33, which are typically aluminum leads, are deposited on the under glaze 39 and over the edges of the heating elements 34. The common return ends or terminals are positioned at predetermined locations to allow clearance for wire-bonding to the electrodes of the daughterboard 19, after the channel plate 31 is attached to make a printhead. The common return 35 and the addressing electrodes 33 are deposited to a thickness of 0.5–3 micrometers, with the preferred thickness being 1.5 micrometers.

In the preferred embodiment, a silicon dioxide thermal oxide layer 17 is grown from the polysilicon heating elements 34 in high temperature steam. The thermal oxide layer is typically grown to a thickness of 0.5–1 micrometer to protect and insulate the heating elements 34 from the conductive ink. The thermal oxide is removed at the edges of the polysilicon heating elements for attachment of the addressing electrodes 33 and common return 35, which are then patterned and deposited. Before electrode passivation, a tantalum (Ta) layer (not shown) may be optionally deposited to a thickness of about 1 micrometer on the heating element protective layer 17 for added protection thereof against the cavitation forces generated by the collapsing ink vapor bubbles during printhead operation. The tantalum layer is etched off all but the protective layer 17 directly over the heating elements using, for example, $CF_4/O_2$ plasma etching. For electrode passivation, a two micrometer thick phosphorous doped CVD silicon dioxide film 16 is deposited over the entire wafer surface, including the plurality of sets of heating elements and addressing electrodes. The passivation film 16 provides an insulating barrier which will protect the exposed electrodes from the ink. Other insulating barriers may be used, such as, for example, polyimide, plasma nitride, as well as the above-mentioned phosphorous doped silicon dioxide, or any combinations thereof. An effective insulating barrier layer is achieved when its thickness is between 1000 Angstrom and 10 micrometers with the preferred thickness being 1 micrometer. The passivation film or layer 16 is etched off of the terminal ends of the common return and addressing electrodes for wire-bonding later with the daughterboard electrodes. This etching of the silicon dioxide film may be by either the wet or dry etching method. Alternatively, the electrode passivation may be accomplished by plasma deposited silicon nitride ($Si_3N_4$).

Next, a thick film-type insulative layer 18 such as, for example, Riston®, Vacrel®, Probimer 52® or polyimide is formed on the passivation layer 16 having a thickness of between 10 and 100 micrometers and preferably in the range of 25 to 50 micrometers. The insulative layer 18 is photolithographically processed to enable etching and removal of those portions of the layer 18 over each heating element 34 forming recesses 26, the elongated recess 38 for providing ink passage from the manifold 24 to the ink channels 20, and over each electrode terminal 32, 37. The elongated recess 38 is formed by the removal of this portion of the thick film layer 18. Thus, the passivation layer 16 alone protects the electrodes 33 from exposure to the ink in this elongated recess 38. Each layer 18 is photolithographically patterned and etched to remove it from the heating element 34 and its protective layer 17, at a predetermined location to permit ink flow from the manifold to the channels, and to remove it from the electrode terminals 32, 37, so that a recess or pit is formed having walls 42 that exposes each heating element, and walls 15 defining an elongated recess to open the ink channels to the manifold. The recess walls 42 inhibit lateral movement of each bubble generated by the pulsed heating elements which lie at the bottom of recesses 26, and thus promote bubble growth in a direction normal thereto. Therefore, as disclosed in U.S. Pat. No. 4,638,337, the blowout phenomena of releasing a burst of vaporized ink is avoided.

As disclosed in U.S. Pat. Nos. 4,601,777 and 4,638,377, the channel plate is formed from a two-side polished, (100) silicon wafer to produce a plurality of upper substrates 31 for the printhead. After the wafer is chemically cleaned, a pyrolytic CVD silicon nitride layer (not shown) is deposited on both sides. Using conventional photolithography, a via for fill hole 25 for each of the plurality of channel plates 31 and at least two vias for alignment openings (not shown) at predetermined locations are printed on one wafer side. The silicon nitride is plasma etched off the patterned vias representing the fill holes and alignment openings. A potassium hydroxide (KOH) anisotropic etch may be used to etch the fill holes and alignment openings. In this case, the (111) planes of the (100) wafer make an angle of 54.7° with the surface of the wafer. The fill holes are small square surface patterns of about 20 mils (0.5 millimeters) per side and the alignment openings are about 60–80 mils (1.52 millimeters square). Thus, the alignment openings are etched entirely through the 20 mil (0.5 millimeter) thick wafer while the fill holes are etched to a terminating apex at about half way through to three-quarters through the wafer. The relatively small square fill hole is invariant to further size increase with continued etching so that the etching of the alignment openings and fill holes are not significantly time constrained. Next, the opposite side of the wafer is photolithographically patterned, using the previously etched alignment holes as a reference to form the relatively large rectangular recesses 24 and sets of elongated, parallel channel recesses that will eventually become the ink manifolds and channels of the printheads. The surface of the wafer containing the manifold and channel recesses are portions of the original wafer surface (covered by a silicon nitride layer) on which adhesive will be applied later for bonding it to the substrate containing the plurality of sets of heating elements. A final dicing cut, which produces end face 29, opens one end of the elongated groove 20 producing nozzle 27. The other end of the channel groove 20 remains closed by end 21. However, the alignment and bonding of the channel plate to the heater plate places the ends 21 of channels 20 directly over elongated recess 38 in the thick film insulative layer 18 as shown in FIG. 5.

In recapitulation, this invention relates to an improved method of fabricating the resistive heating elements of a thermal ink jet transducer. By first depositing an amorphous silicon film, which is then heated so that recrystallization takes place, the resulting polycrystalline film resistive heating element has a (111) texture. The resulting texture of the resistive heating elements is much more uniform than that achieved using previous methods and therefore the thermal ink jet printhead transducers exhibit tighter resistance control and longer life time. Additionally, the increased smoothness of the surface of the resistive heating elements makes them less susceptible to cavitation damage, electromigration stress and reduces intrinsic stress.

While the invention has been described with reference to particular preferred embodiments, the invention is not limited to the specific examples given. Other embodiments and modifications can be made by those skilled in the art without departing from the spirit and scope of the attached claims.

What is claimed is:

1. A method of forming a thermal ink jet printhead including an array of resistive heating elements formed on a semiconductive substrate coated with an under glaze layer, comprising:

a) depositing an amorphous silicon film on plural selected portions of the under glaze layer of said semiconductive substrate;

b) implanting a dopant into said selectively deposited amorphous silicon film;

c) heating said doped deposited amorphous silicon film so that it undergoes solid phase epitaxy to form a (111) polycrystalline silicon film having a sheet resistance in the range of 20Ω to 100Ω, so that each of said plural selective portions contains a polycrystalline heating element;

d) depositing a common return electrode attached to all of said heating elements, and an address electrode for each respective heating element on said under glaze layer;

e) forming a thick film insulative layer over said common and address electrodes, and said under glaze layer except for said heating elements; and f) bonding a channel plate to said thick film insulative layer of said semiconductive substrate, said channel plate having a plurality of channels corresponding in number and location to the heating elements formed on said semiconductive substrate so that each heating element is located in a corresponding one of said channels, said channel plate also including an ink supply manifold in fluid communication with said channels.

2. The method according to claim 1, wherein said silicon film is deposited by the thermal decomposition of a material selected from the group consisting of silane, disilane and dichlorosilane.

3. The method according to claim 2, wherein said silicon film is deposited from silane thermal decomposition.

4. The method according to claim 1, wherein said dopant is selected from the group consisting of boron, arsenic and phosphorous.

5. The method according to claim 1, wherein said amorphous silicon film is deposited at a temperature below 580° C.

6. The method according to claim 5, wherein said amorphous silicon film is deposited at a temperature in the range between 550° C. and 580° C.

7. The method according to claim 1, wherein said amorphous silicon film is deposited by low pressure chemical vapor deposition.

8. The method according to claim 7, wherein said amorphous silicon film is deposited at a pressure in the range between 50 mTORR and 500 mTORR.

9. The method according to claim 8, wherein said amorphous silicon film is deposited at a pressure of about 200 mTorr.

10. A method of forming a resistive heating element for a thermal ink jet printhead, comprising:

a) coating a semiconductive substrate with an under glaze layer;

b) depositing an amorphous silicon film on selected portions of the under glaze layer of said semiconductive substrate;

c) heating said deposited amorphous silicon film so that it undergoes solid phase epitaxy to form a polycrystalline silicon film, said polysilicon being doped to provide a sheet resistance in the range of 20Ω to 100Ω, and having a smooth surface resistant to cavitation damage;

d) depositing a return electrode and an address electrode on said under glaze layer attached to said polycrystalline silicon film; and e) forming an insulative film layer over said under glaze layer, including said return and address electrodes, except for said polycrystalline silicon film.

11. The method according to claim 10, wherein said under glaze layer is a layer of silicon dioxide.

12. The method according to claim 10, wherein said silicon film is deposited by the thermal decomposition of a material selected from the group consisting of silane, disilane and dichlorosilane.

13. The method according to claim 12, wherein said silicon film is deposited from silane thermal decomposition.

14. The method according to claim 10, wherein said polysilicon is doped with a dopant selected from the group consisting of boron, arsenic and phosphorous.

15. The method according to claim 10, wherein said amorphous silicon film is deposited at a temperature below 580° C.

16. The method according to claim 15, wherein said amorphous silicon film is deposited at a temperature in the range between 550° C. and 580° C.

17. The method according to claim 10, wherein said amorphous silicon film is deposited by low pressure chemical vapor deposition.

18. The method according to claim 17, wherein said amorphous silicon film is deposited at a pressure in the range between 50 mTORR and 500 mTORR.

19. The method according to claim 18, wherein said amorphous silicon film is deposited at a pressure of about 200 mTorr.

20. The method according to claim 10, wherein said polycrystalline film has a (111) texture.

* * * * *